(12) United States Patent
Guo

(10) Patent No.: US 11,515,365 B2
(45) Date of Patent: Nov. 29, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wanghui Guo, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 139 days.

(21) Appl. No.: 16/963,514

(22) PCT Filed: Jun. 3, 2020

(86) PCT No.: PCT/CN2020/094091
§ 371 (c)(1),
(2) Date: Jul. 21, 2020

(87) PCT Pub. No.: WO2021/223279
PCT Pub. Date: Nov. 11, 2021

(65) Prior Publication Data
US 2021/0351250 A1    Nov. 11, 2021

(51) Int. Cl.
*H01L 27/32* (2006.01)
*H01L 51/52* (2006.01)

(52) U.S. Cl.
CPC ........ *H01L 27/3227* (2013.01); *H01L 27/323* (2013.01); *H01L 27/3246* (2013.01); *H01L 51/5293* (2013.01)

(58) Field of Classification Search
CPC . H01L 27/3246; H01L 27/326; H01L 27/323; H01L 27/3227; H01L 51/5293
See application file for complete search history.

(56) References Cited

U.S. PATENT DOCUMENTS

2010/0171419 A1* 7/2010 Kim ................... H01L 51/5268
313/505
2015/0214284 A1* 7/2015 Kim ...................... H01L 51/525
257/40

(Continued)

FOREIGN PATENT DOCUMENTS

CN    109119446 A    1/2019
CN    109817825 A    5/2019

(Continued)

*Primary Examiner* — Vongsavanh Sengdara
(74) *Attorney, Agent, or Firm* — Mark M. Friedman

(57) ABSTRACT

A display panel and a display device are disclosed. The display panel includes an array substrate, a photo spacer layer, and a light-emitting function layer. The photo spacer layer and the light-emitting function layer are sequentially disposed on the array substrate. The display panel includes a display area and a sensor light-receiving area, The light-emitting function layer is disposed in the display area and the sensor light-receiving area. The photo spacer layer includes a plurality of first photo spacers disposed in the display area and a plurality of second photo spacers disposed in the sensor light-receiving area. A distribution density of the second photo spacers is less than a distribution density of the first photo spacers.

18 Claims, 5 Drawing Sheets

(56) References Cited

U.S. PATENT DOCUMENTS

| | | | |
|---|---|---|---|
| 2018/0020193 A1 | 1/2018 | Blum et al. | |
| 2018/0331164 A1* | 11/2018 | Hsu | H01L 27/3209 |
| 2019/0051707 A1* | 2/2019 | Li | G06F 3/0443 |
| 2020/0227494 A1* | 7/2020 | Bae | H01L 27/3248 |
| 2020/0235187 A1* | 7/2020 | Bae | H01L 27/3272 |
| 2020/0258967 A1* | 8/2020 | Kim | H01L 27/3225 |
| 2020/0335730 A1* | 10/2020 | Oh | H01L 51/5225 |

FOREIGN PATENT DOCUMENTS

| | | |
|---|---|---|
| CN | 110045533 A | 7/2019 |
| CN | 209327746 U | 8/2019 |
| CN | 209460748 U | 10/2019 |
| CN | 110873985 A | 3/2020 |

* cited by examiner

DISPLAY PANEL AND DISPLAY DEVICE

FIELD OF INVENTION

The present disclosure relates to the field of display panel technologies, and particularly relates to a display panel and a display device.

BACKGROUND OF INVENTION

With the continuous development of science and technology, the display technology field is constantly updated. Full screen brand-new displays have brought people a brand-new visual experience and sensory impact due to its high screen-to-body ratio, which has become a goal pursued by display manufacturers.

In order to achieve larger screen-to-body ratios and full screen display, a structural design of placing optical sensors (such as a camera) under a display panel has become a mainstream trend. Wherein, one scheme is to remove films corresponding to a sensor light-receiving area of the display panel, that is, the sensor light-receiving area is not used for displaying; another scheme is to retain the films corresponding to the sensor light-receiving area of the display panel and use them for displaying. As a screen of the second scheme has a larger display area, it has become a competing goal in the industry. However, a light transmittance of the sensor light-receiving area of the display panel is low as there are a large number of films in the sensor light-receiving area of the display panel, thereby causing poor light-receiving effect of the optical sensors and causing the optical sensors to perform poorly. Therefore, a present main research direction is to improve a light transmittance of the sensor light-receiving area on the basis of ensuring that the sensor light-receiving area of the display panel is used for displaying.

Technical Problems

The present disclosure provides a display panel and a display device, wherein a light transmittance of the sensor light-receiving area can be improved by reducing a distribution density and an area of photo spacers in the sensor light-receiving area of the display panel, and reducing a thickness of organic films in the display panel.

Technical Solutions

In a first aspect, the present disclosure provides a display panel, including an array substrate, a photo spacer layer, and a light-emitting function layer, wherein the photo spacer layer and the light-emitting function layer are sequentially disposed on the array substrate;

wherein the display panel includes a display area and a sensor light-receiving area disposed in the display area, the light-emitting function layer is disposed in the display area and the sensor light-receiving area, the photo spacer layer includes a plurality of first photo spacers disposed in the display area and arranged at intervals with each other, and a plurality of second photo spacers disposed in the sensor light-receiving area and arranged at intervals with each other; and wherein a distribution density of the plurality of second photo spacers is less than a distribution density of the plurality of first photo spacers.

In the display panel provided by the present disclosure, a projection area of each of the second photo spacers in a direction perpendicular to the array substrate is less than a projection area of each of the first photo spacers in the direction perpendicular to the array substrate.

In the display panel provided by the present disclosure, a material of the photo spacer layer includes an organic photoresist material.

In the display panel provided by the present disclosure, the array substrate includes a thin film transistor array and an organic planarization layer covering the thin film transistor array, and the photo spacer layer is disposed on a side of the organic planarization layer away from the thin film transistor array;

wherein a thickness of the organic planarization layer ranges from 1 micron to 1.3 microns.

In the display panel provided by the present disclosure, the display panel further includes a pixel defining layer disposed between the organic planarization layer and the photo spacer layer, wherein a plurality of pixel openings are defined in the pixel defining layer, and the light-emitting function layer is disposed in the plurality of pixel openings;

wherein a thickness of the pixel defining layer ranges from 1 micron to 1.3 microns.

In the display panel provided by the present disclosure, the plurality of pixel openings include a plurality of first pixel openings located in the display area and a plurality of second pixel openings located in the sensor light-receiving area;

wherein a distribution density of the plurality of second pixel openings is less than a distribution density of the plurality of first pixel openings.

In the display panel provided by the present disclosure, a material of the pixel defining layer is same as a material of the photo spacer layer.

In the display panel provided by the present disclosure, a plurality of anodes are disposed between the pixel defining layer and the organic planarization layer, and the plurality of anodes correspond one-to-one to the plurality of pixel openings;

wherein the light-emitting function layer includes a hole-injection layer disposed on each of the anodes, a hole transport layer, a light-emitting layer, an electron transport layer, an electron injection layer, and a cathode layer; the hole transport layer, the light-emitting layer, the electron transport layer, the electron injection layer, and the cathode layer are sequentially disposed on the hole-injection layer; and the hole-injection layer, the hole transport layer, the electron transport layer, the electron injection layer, and the cathode layer all extend to cover the pixel definition layer and the photo spacer layer.

In the display panel provided by the present disclosure, the display panel further includes a base substrate disposed on a side of the array substrate away from the photo spacer layer, and a package layer, a polarizer, and a protective cover plate sequentially disposed on a side of the light-emitting function layer away from the photo spacer layer.

In the display panel provided by the present disclosure, the display panel further includes a touch layer disposed between the package layer and the polarizer.

In a second aspect, the present disclosure further provides a display device, including a display panel and an optical sensor disposed on a back of the display panel;

wherein the display panel includes an array substrate, a photo spacer layer, and a light-emitting function layer, wherein the photo spacer layer and the light-emitting function layer are sequentially disposed on the array substrate;

wherein the display panel includes a display area and a sensor light-receiving area disposed in the display area, the light-emitting function layer is disposed in the display area and the sensor light-receiving area, the photo spacer layer includes a plurality of first photo spacers disposed in the display area and arranged at intervals with each other, and a plurality of second photo spacers disposed in the sensor light-receiving area and arranged at intervals with each other; and a distribution density of the plurality of second photo spacers is less than a distribution density of the plurality of first photo spacers; and wherein the optical sensor corresponds to the sensor light-receiving area.

In the display device provided by the present disclosure, the optical sensor includes any one of a camera, a fingerprint recognition sensor, and a face recognition sensor.

In the display device provided by the present disclosure, a projection area of each of the second photo spacers in a direction perpendicular to the array substrate is less than a projection area of each of the first photo spacers in the direction perpendicular to the array substrate.

In the display device provided by the present disclosure, a material of the photo spacer layer includes an organic photoresist material.

In the display device provided by the present disclosure, the array substrate includes a thin film transistor array and an organic planarization layer covering the thin film transistor array, and the photo spacer layer is disposed on a side of the organic planarization layer away from the thin film transistor array;

wherein a thickness of the organic planarization layer ranges from 1 micron to 1.3 microns.

In the display device provided by the present disclosure, the display panel further includes a pixel defining layer disposed between the organic planarization layer and the photo spacer layer, wherein a plurality of pixel openings are defined in the pixel defining layer, and the light-emitting function layer is disposed in the plurality of pixel openings;

wherein a thickness of the pixel defining layer ranges from 1 micron to 1.3 microns.

In the display device provided by the present disclosure, the plurality of pixel openings include a plurality of first pixel openings located in the display area and a plurality of second pixel openings located in the sensor light-receiving area;

wherein a distribution density of the plurality of second pixel openings is less than a distribution density of the plurality of first pixel openings.

In the display device provided by the present disclosure, a material of the pixel defining layer is same as a material of the photo spacer layer.

In the display device provided by the present disclosure, a plurality of anodes are disposed between the pixel defining layer and the organic planarization layer, and the plurality of anodes correspond one-to-one to the plurality of pixel openings;

wherein the light-emitting function layer includes a hole-injection layer disposed on each of the anodes, a hole transport layer, a light-emitting layer, an electron transport layer, an electron injection layer, and a cathode layer; the hole transport layer, the light-emitting layer, the electron transport layer, the electron injection layer, and the cathode layer are sequentially disposed on the hole-injection layer; and the hole-injection layer, the hole transport layer, the electron transport layer, the electron injection layer, and the cathode layer all extend to cover the pixel definition layer and the photo spacer layer.

In the display device provided by the present disclosure, the display panel further includes a base substrate disposed on a side of the array substrate away from the photo spacer layer, and a package layer, a polarizer, and a protective cover plate sequentially disposed on a side of the light-emitting function layer away from the photo spacer layer.

Beneficial Effects

Compared with the prior art, in the display panel and the display device provided by the present disclosure, the display panel includes a display area and a sensor light-receiving area, and the light-emitting function layer is disposed in the display area and the sensor light-receiving area, which can realize full screen display. And the photo spacer layer of the display panel includes a plurality of first photo spacers disposed in the display area and arranged at intervals with each other, and a plurality of second photo spacers disposed in the sensor light-receiving area and arranged at intervals with each other; and a distribution density of the plurality of second photo spacers is less than a distribution density of the plurality of first photo spacers, thereby making distances between the plurality of second photo spacers in the sensor light-receiving area larger, which is conducive to the light transmission, thereby improving the light transmittance.

DESCRIPTION OF DRAWINGS

Following describes specific implementations of the present disclosure in detail with reference to accompanying drawings, which will make the technical solutions and other beneficial effects of the present disclosure obvious.

DETAILED DESCRIPTION OF EMBODIMENTS

Figure 1:
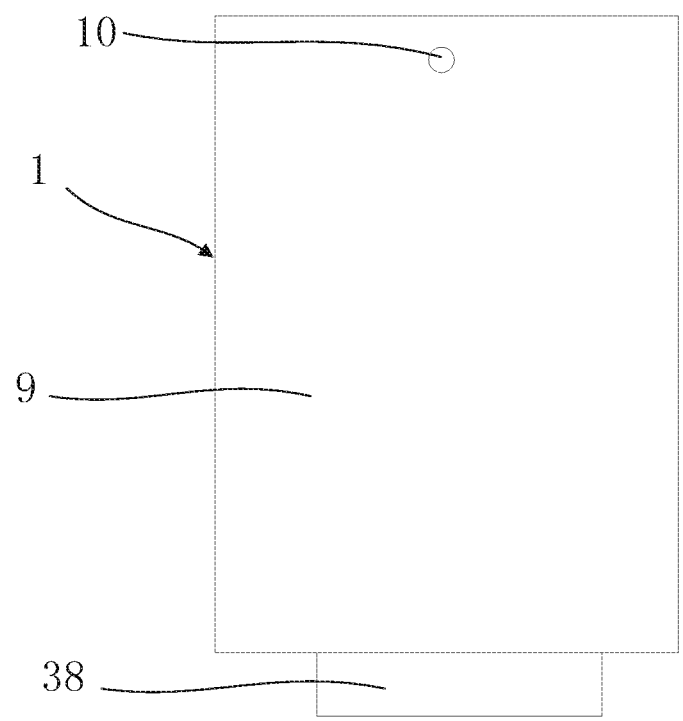
FIG. 1 is a top-down structural schematic view of a display panel provided in an embodiment of the present disclosure.

A clearly and completely description of the technical solution will be given in combination with the accompanying drawings in the embodiments of the present disclosure. Obviously, the embodiments described are only a part of embodiments of the present disclosure and not all of them. Based on the embodiment of the present disclosure, all other embodiments obtained by those skilled in the art without making any invention efforts all belong to a protection scope of the present disclosure.

In the description of the present disclosure, it should be understood that, orientational or positional relationships indicated by teens such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", etc. are based on orientational or positional relationships shown in the drawings. These terms are only for convenience describing the present disclosure and simplifying the description, and do not indicate or imply that devices or elements referred to must have specific orientations, be constructed and operate in specific orientations, and therefore cannot be understood as a limitation on present disclosure. In addition, terms such as "first" and "second" are used herein for purposes of description, and should not be interpreted as indicate or imply relative importance or significance. Therefore, features limited by terms such as "first" and "second" can explicitly or impliedly includes one or more than one these features. In the description of the present disclosure, "a plurality of" means two or more than two, unless otherwise specified.

In description of the present disclosure, it should be noted, the terms "install", "connect", and "couple" shall be understood broadly, unless otherwise explicitly stated and defined, and may be, for example, a fixed connection, a detachable connection, or an integral connection; a mechanical connection or an electrical connection; directly connected or indirectly connected through an intermediate medium; an internal connection of the two elements. The specific meanings of the above terms in the present disclosure can be understood in the specific circumstances for those skilled in the art.

In the present disclosure, unless specifically stated and defined otherwise, that a first feature is "on" or "under" a second feature may include: the first feature and the second feature are not in direct contact but are contacted by another feature between them. Furthermore, that the first feature is on "above", or "upon" the second feature includes that the first feature is directly above and obliquely above the second feature, or merely indicates that the first feature is higher in level than the second feature. That the first feature is "under" or "below" the second feature includes that the first feature is directly below and obliquely below the second feature, or merely indicates that the first feature is lower in level than the second feature.

Following disclosure provides various different implementations or examples for implementing different structures of the present disclosure. To simplify the disclosure of the present disclosure, components and settings of specific examples are described below. Of course, they are merely examples and are not intended to limit the present disclosure. In addition, the present disclosure may repeat reference numbers and/or reference letters in different examples, and such repetition is for purpose of simplicity and clarity, and does not indicate relationship between the various embodiments and/or settings discussed. In addition, examples of various specific processes and materials are provided in the present disclosure, but those of ordinary skill in the art may be aware of application of other processes and/or other materials.

In order to improve a light transmittance of a sensor light-receiving area of a display panel, an exemplary method is to reduce a pixel density of the sensor light-receiving area to improve the light transmittance. Although reducing the pixel density can reduce an area of metal layers in the sensor light-receiving area and improve the light transmittance in a certain extent, the light transmittance still cannot reach an ideal effect.

At present, organic films of the display panel are generally made of an organic photoresist material. Experimental research shows that for organic photoresists, a transmittance of blue light and a transmittance of purple light are less than 80%, and the light transmittance decreases as a thickness of the organic photoresists increases. Therefore, simply reducing the pixel density of the sensor light-receiving area of the display panel does not reduce an influence of the organic films on the light transmittance.

Generally, the organic films of the display panel include a planarization (PLN) layer, a pixel definition layer (PDL), and a photo spacer (PS) layer. The planarization layer, the pixel definition layer, and the photo spacer layer are disposed in a display area and a sensor light-receiving area. In an exemplary display panel, a thickness of the planarization layer, a thickness of the pixel definition layer, and a thickness of the photo spacer layer are 1.5 microns. The photo spacer layer includes a plurality of photo spacers arranged at intervals with each other, and a distribution density of the photo spacers in the display area of the display panel is consistent with a distribution density of the photo spacers in the sensor light-receiving area of the display panel. Embodiments of the present disclosure improve the light transmittance of the sensor light-receiving area by reducing the distribution density and an area of the photo spacers in the sensor light-receiving area of the display panel and reducing a thickness of the organic films including the planarization layer and the pixel definition layer.

Figure 2:
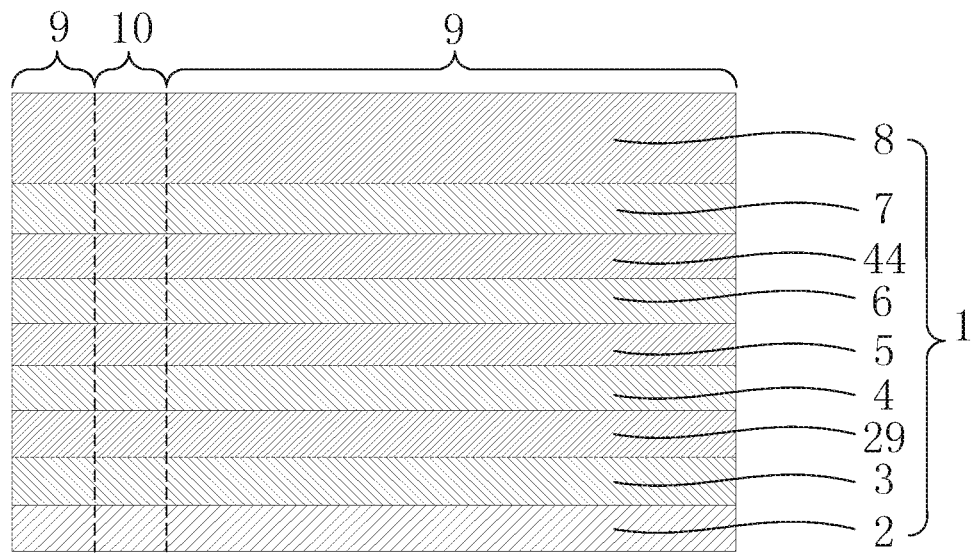
FIG. 2 is a sectional structural schematic view of the display panel provided in the embodiment of the present disclosure.
Figure 3:
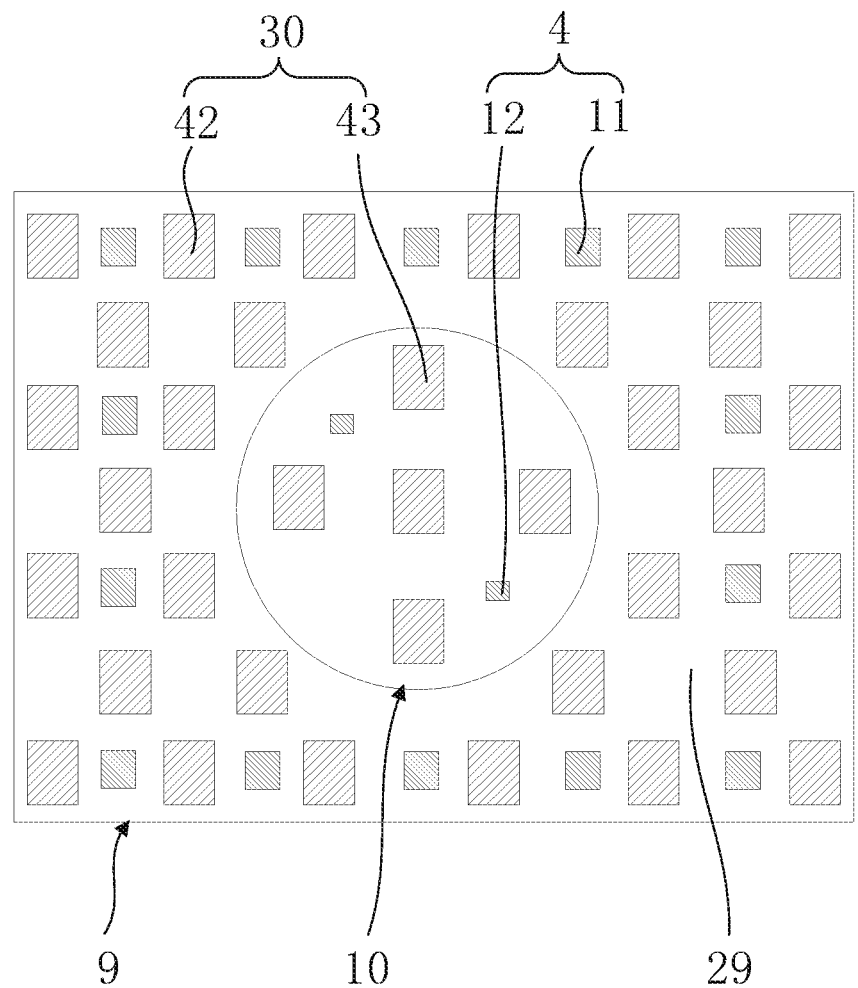
FIG. 3 is a top-down structural schematic view of a partial pixel defining layer and a photo spacer layer provided in the embodiment of the present disclosure.

Specifically, combining with FIG. 1 to FIG. 6, the embodiment of the present disclosure provides a display panel 1. As shown in FIG. 1, the display panel 1 includes a display area 9 and a sensor light-receiving area 10 disposed in the display area 9. As shown in FIG. 2, the display panel 1 includes a base substrate 2, and an array substrate 3, a photo spacer layer 4, a light-emitting function layer 5, a package layer 6, a polarizer 7, and a protective cover plate 8 sequentially disposed on the base substrate 2. The light-emitting function layer 5 is disposed in the display area 9 and the sensor light-receiving area 10. As shown in FIG. 3, the photo spacer layer 4 includes a plurality of first photo spacers 11 disposed in the display area 9 and arranged at intervals with each other, and a plurality of second photo spacers 12 disposed in the sensor light-receiving area 10 and arranged at intervals with each other. A distribution density of the plurality of second photo spacers 12 is less than a distribution density of the plurality of first photo spacers 11.

Specifically, a material of the photo spacer layer 4 includes an organic photoresist material. The photo spacer layer 4 is configured to support upper films, which is conducive to protecting the array substrate 3.

Figure 4:
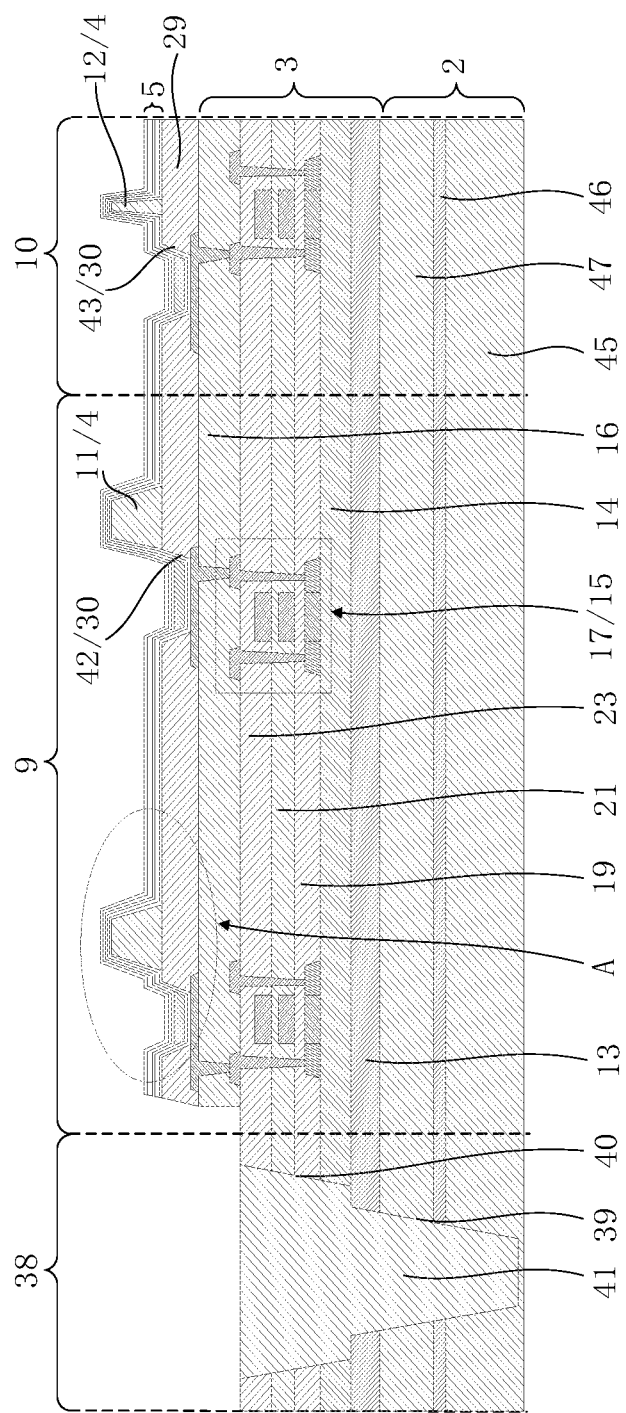
FIG. 4 is a partially sectional structural schematic view of the display panel provided in the embodiment of the present disclosure.

Specifically, the base substrate 2 may be a single layer, a double layer, or a sandwich structure. In the embodiment of the present disclosure, the sandwich structure is taken as an example, that is, the base substrate 2 includes a first organic layer 45, an inorganic layer 46, and a second organic layer 47, as shown in FIG. 4. Materials of the first organic layer 45 and the second organic layer 47 include polyimide (PI), and a material of the inorganic layer 46 includes silicon oxide or silicon nitride.

Specifically, as shown in FIG. 4, the array substrate 3 includes a water oxygen barrier layer 13, a buffer layer 14, and a thin film transistor array 15 sequentially disposed on the second organic layer 47 of the base substrate 2, and an organic planarization layer 16 covering the thin film transistor array 15. The photo spacer layer 4 is disposed on a side of the organic planarization layer 16 away from the thin film transistor array 15.

Figure 5:
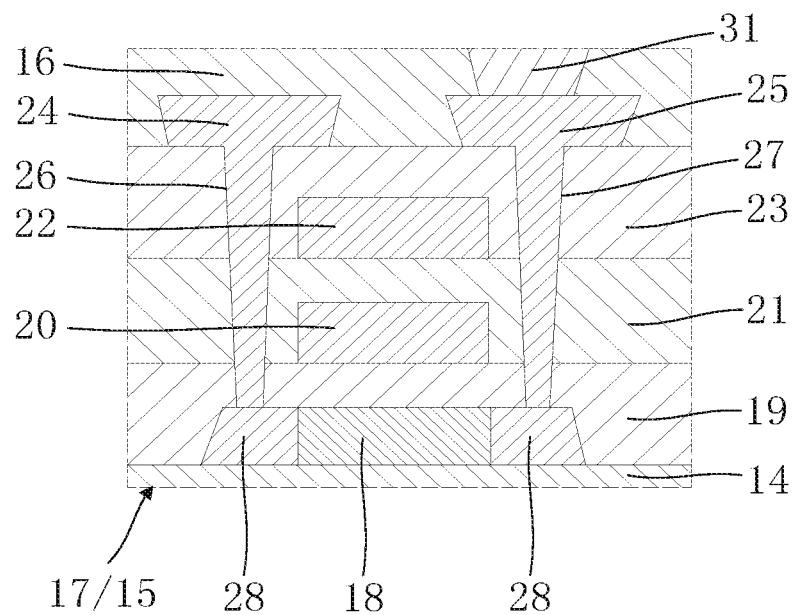
FIG. 5 is an enlarged view of a thin film transistor in FIG. 4.

Specifically, as shown in FIG. 4 and FIG. 5, the thin film transistor array 15 includes a plurality of thin film transistors 17 distributed in an array. Each of the thin film transistors 17 includes a semiconductor unit 18 disposed on the buffer layer 14, a first gate insulating layer 19 covering the buffer layer 14 and the semiconductor unit 18, a first gate 20 disposed on the first gate insulating layer 19 and corresponding to the semiconductor unit 18, a second gate insulating layer 21 covering the first gate insulating layer 19 and the first gate 20, a second gate 22 disposed on the second gate insulating layer 21 and corresponding to the first gate 20, an interlayer dielectric layer 23 covering the second gate insulating layer 21 and the second gate 22, and a source electrode 24 and a drain electrode 25 disposed on the interlayer dielectric layer 23 and corresponding to two ends of the semiconductor unit 18, respectively. Additionally, the source electrode 24 and the drain electrode 25 are respectively connected with the two ends of the semiconductor unit 18 through a first contact hole 26 and a second contact hole 27 penetrating the interlayer dielectric layer 23, the second gate insulating layer 21, and the first gate insulating layer 19. The first gate insulating layer 19 of the plurality of thin film transistors 17 is disposed in a full layer, the second gate insulating layer 21 of the plurality of thin film transistors 17 is disposed in a full layer, and the interlayer dielectric layer 23 of the plurality of thin film transistors 17 is disposed in a full layer.

Specifically, ohmic contact units 28 are further disposed on the two ends of the semiconductor unit 18, and the source electrode 24 and drain electrode 25 are respectively connected with the ohmic contact units 28 at the two ends of the semiconductor unit 18 through the first contact hole 26 and the second contact hole 27, respectively.

It should be noted that the thin film transistors 17 can also be single gate structures, and specific structures of the thin film transistors 17 are not limited in the present disclosure.

Specifically, as shown in FIG. 4, the display panel 1 further includes a pixel defining layer 29 disposed between the organic planarization layer 16 and the photo spacer layer 4. A plurality of pixel openings 30 are defined in the pixel defining layer 29, and the light-emitting function layer 5 is disposed in the plurality of pixel openings 30.

Figure 6:
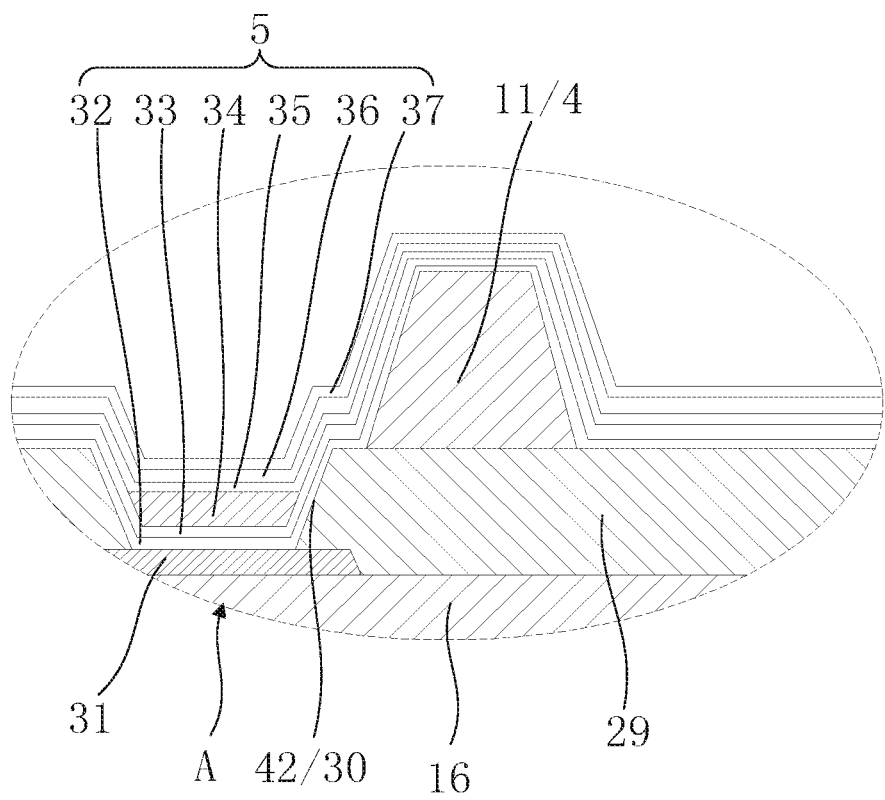
FIG. 6 is an enlarged view of an area A in FIG. 4.

Specifically, as shown in FIG. 4, a plurality of anodes 31 are disposed between the pixel defining layer 29 and the organic planarization layer 16, the plurality of anodes 31 correspond one-to-one to the plurality of pixel openings 30, and each of the anodes 31 is electrically and correspondingly connected to the drain electrodes 25 of the thin film transistors 17 through via holes penetrating the organic planarization layer 16. As shown in FIG. 6, the light-emitting function layer 5 includes a hole-injection layer 32 disposed on each of the anodes 31, a hole transport layer 33, a light-emitting layer 34, an electron transport layer 35, an electron injection layer 36, and a cathode layer 37. The hole transport layer 33, the light-emitting layer 34, the electron transport layer 35, the electron injection layer 36, and the cathode layer 37 are sequentially disposed on the hole-injection layer 32. The hole-injection layer 32, the hole transport layer 33, the electron transport layer 35, the electron injection layer 36, and the cathode layer 37 all extend to cover the pixel definition layer 29 and the photo spacer layer 4.

Specifically, when manufacturing the light-emitting functional layer 5, the hole-injection layer 32, the hole transport layer 33, the electron transport layer 35, the electron injection layer 36, and the cathode layer 37 are formed by laying a full layer, so that the hole-injection layer 32, the hole transport layer 33, the electron transport layer 35, the electron injection layer 36, and the cathode layer 37 covers the photo spacer layer 4 and the pixel definition layer 29, while the light-emitting layer 34 is disposed in the plurality of pixel openings 30.

Specifically, the light-emitting layer 34 includes red light-emitting units (R), green light-emitting units (G), and blue light-emitting units (B), each of the pixel openings 30 is provided with any one of the red light-emitting unit, the green light-emitting unit, and the blue light-emitting unit.

Specifically, the package layer 6 is a film packaging layer, which includes a first inorganic packaging layer, an organic packaging layer, and a second inorganic packaging layer sequentially disposed on the light-emitting function layer 5.

Specifically, the protective cover plate 8 refers to a cover glass (CG).

Specifically, as shown in FIG. 2, the display panel 1 further includes a touch layer 44 disposed between the package layer 6 and the polarizer 7.

Specifically, as shown in FIG. 1 and FIG. 4, the display panel 1 further includes a bending area 38 located on a side of the display area 9. The base substrate 2, the water oxygen barrier layer 13, the buffer layer 14, the first gate insulating layer 19, the second gate insulating layer 21, and the interlayer dielectric layer 23 extend from the display area 9 to the bending area 38. Before the first contact hole 26 and the second contact hole 27 are defined, through holes (such as a first through hole 39 and a second through hole 40 described below) penetrating at least the water oxygen barrier layer 13, the buffer layer 14, the first gate insulating layer 19, the second gate insulating layer 21, and the interlayer dielectric layer 23 are defined in the bending area 38, and the through holes are filled with an organic buffer material 41. As materials of the water oxygen barrier layer 13, the buffer layer 14, the first gate insulating layer 19, the second gate insulating layer 21, and the interlayer dielectric layer 23 are inorganic materials, there is a high risk of fracture in a bending process of the bending area 38, wherein filling the bending area 38 with the organic buffer material 41 can achieve a buffer effect to prevent films in the bending area 38 from fracturing during bending.

Specifically, the through holes extend to the first organic layer 45 of the base substrate 2. The through holes include the first through hole 39 and the second through hole 40, the first through hole 39 penetrates through the water oxygen barrier layer 13 and extends to the first organic layer 45 of the base substrate 2, and the second through hole 40 is located on the first through hole 39 and penetrates the buffer layer 14, the first gate insulating layer 19, the second gate insulating layer 21, and the interlayer dielectric layer 23. Wherein, a projection area of the second through hole 40 in a direction perpendicular to the display panel 1 is greater than a projection area of the first through hole 39 in the direction perpendicular to the display panel 1. A reason for this treatment is that when the bending area 38 is bent towards the back of the substrate 2, bending radii of the base substrate 2 and the water oxygen barrier layer 13 are smaller, so that the base substrate 2 and the water oxygen barrier layer 13 are easily subjected to large bending and extrusion pressures; while bending radii of the buffer layer 14, the first gate insulating layer 19, the second gate insulating layer 21, and the interlayer dielectric layer 23 are larger, and the buffer layer 14, the first gate insulating layer 19, the second gate insulating layer 21, and the interlayer dielectric layer 23 are made of inorganic materials, so that the buffer layer 14, the first gate insulating layer 19, the second gate insulating layer 21, and the interlayer dielectric layer 23 are easily subjected to large bending and stretching pressures. An opening radius of the second through hole 40 is greater than an opening radius of the first through hole 39, causing the second through hole 40 to be larger and contain more organic buffer material 41 and causing the first through hole 39 to be smaller and contain less organic buffer material 41, thereby not only preventing films with larger bending radius from breaking due to tension, but also preventing films with smaller bending radius from breaking due to extrusion pressure.

In the embodiment, the display panel 1 includes the display area 9 and the sensor light-receiving area 10, and the light-emitting function layer 5 is disposed in the display area 9 and the sensor light-receiving area 10, which can realize full screen display. Additionally, the photo spacer layer 4 of the display panel 1 includes the plurality of first photo spacers 11 disposed in the display area 9 and arranged at intervals with each other, and the plurality of second photo spacers 12 disposed in the sensor light-receiving area 10 and arranged at intervals with each other; and the distribution density of the plurality of second photo spacers 12 is less than the distribution density of the plurality of first photo spacers 11, thereby making distances between the plurality of second photo spacers 12 in the sensor light-receiving area 10 larger, which is conducive to increase a light transmission area, so as to improve the light transmittance of the sensor light-receiving area 10.

In an embodiment, as shown in FIG. 3 and FIG. 4, a projection area of each of the second photo spacers 12 in a direction perpendicular to the array substrate 3 is less than a projection area of each of the first photo spacers 11 in the direction perpendicular to the array substrate 3. That is, a cross-sectional area of each of the second photo spacers 12 is less than a cross-sectional area of each of the first photo spacers 11. It should be noted that the cross-section is parallel to the display surface of the display panel 1.

In the embodiment, on the basis of reducing the distribution density of the second photo spacers 12 in the sensor light-receiving area 10, decreasing the cross-sectional area of each of the second photo spacers 12 in the sensor light-receiving area 10 can further increase a distance between any two adjacent second photo spacers 12, thereby further increasing the light transmission area, which is conducive to further improving the light transmittance of the sensor light-receiving area 10.

In an embodiment, a thickness of the organic planarization layer 16 ranges from 1 micron to 1.3 microns. In the embodiment, on the basis of reducing the distribution density of the second photo spacers 12 in the sensor light-receiving area 10, the thickness of the organic planarization layer 16 in the embodiment is reduced relative to the thickness of an exemplary planarization layer, thereby further reducing an influence of an organic material on light transmittance, which is conducive to further improving the light transmittance of the sensor light-receiving area 10.

In an embodiment, a thickness of the pixel defining layer 29 ranges from 1 micron to 1.3 microns, and a material of the pixel defining layer 29 is same as a material of the photo spacer layer 4. In the embodiment, the material of the pixel defining layer 29 is also the organic material, which may be an organic photoresist material specifically. On the basis of reducing the distribution density of the second photo spacers 12 in the sensor light-receiving area 10, the thickness of the pixel defining layer 29 in the embodiment is reduced relative to the thickness of an exemplary pixel defining layer, thereby further reducing the influence of the organic material on light transmittance, which is conducive to further improving the light transmittance of the sensor light-receiving area 10.

In an embodiment, as shown in FIG. 3 and FIG. 4, the plurality of pixel openings 30 include a plurality of first pixel openings 42 located in the display area 9 and a plurality of second pixel openings 43 located in the sensor light-receiving area 10. Wherein, a distribution density of the plurality of second pixel openings 43 is less than a distribution density of the plurality of first pixel openings 42. That is, a pixel density of the sensor light-receiving area 10 is less than a pixel density of the display area 9.

In the embodiment, on the basis of reducing the distribution density of the second photo spacers 12 in the sensor light-receiving area 10, the pixel density of the sensor light-receiving area 10 is less than the pixel density of the display area 9, which can further increase the light transmission area, thereby further improving the light transmittance of the sensor light-receiving area 10.

Figure 7:
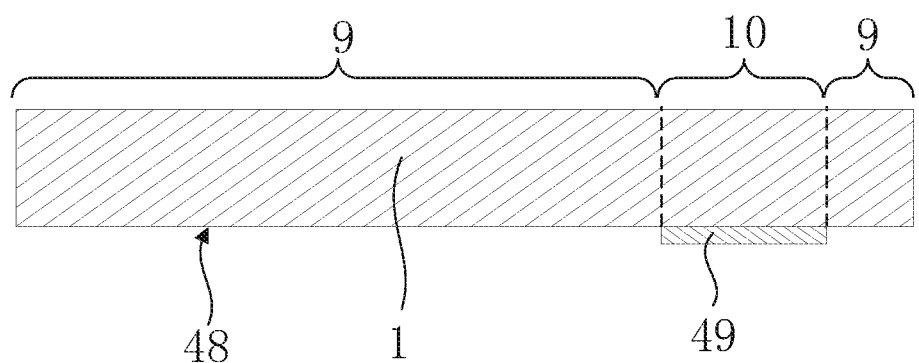
FIG. 7 is a sectional structural schematic view of a display device provided in the embodiment of the present disclosure.

As shown in FIG. 7, an embodiment of the present disclosure further provides a display device 48, including the display panel 1 of the above embodiment and an optical sensor 49 disposed on a back of the display panel 1. The optical sensor 49 corresponds to the sensor light-receiving area 10.

Specifically, the optical sensor 49 includes a camera, a fingerprint recognition sensor, a face recognition sensor, or other sensors.

In the embodiment, the display panel 1 includes the display area 9 and the sensor light-receiving area 10, on one hand, the light-emitting function layer 5 is disposed in the display area 9 and the sensor light-receiving area 10, which can realize full screen display of the display device 48, on the other hand, the distribution density of the second photo spacers 12 in the sensor light-receiving area 10 of the display panel 1 is less than the distribution density of the first photo spacers 11 in the display area 9, and a projection area of the second photo spacer 12 in a direction perpendicular to the array substrate 3 is less than a projection area of the first photo spacer 11 in the direction perpendicular to the array substrate 3, thereby making distances between the plurality of second photo spacers 12 in the sensor light-receiving area 10 larger, which is conducive to increase the light transmission area, and the thickness of the organic planarization layer 16 and the thickness of the pixel defining layer 29 are reduced, thereby reducing the influence of the organic material on the light transmittance. Therefore, the display panel 1 provided in the embodiment of the present disclosure can effectively improve the light transmission of the sensor light-receiving area 10, which is conducive to improving the light-receiving effect of the optical sensor 49, so as to ensure the normal use of the optical sensor 49.

In the above embodiments, description of each embodiment has its own emphasis. For parts not detailed in one embodiment can refer to the relevant description of other embodiments.

The display panel and the display device provided in the embodiments of the present disclosure has been described in detail above. Specific examples are applied to explain principle and implementation mode of the present disclosure in this paper. The description of the above embodiments is merely used to help understand the technical solution and core idea of the application. The ordinary person skilled in the art shall understand that they can still modify the technical solution recorded in the above embodiments, or replace some of the technical features equally. These modifications or substitutions do not make the nature of the corresponding technical solution deviate from the scope of the technical solution of the embodiments of the present disclosure.

What is claimed is:

1. A display panel, comprising an array substrate, a pixel defining layer, a photo spacer layer, and a light-emitting function layer, wherein the pixel defining layer, the photo spacer layer and the light-emitting function layer are sequentially disposed on the array substrate;

wherein the display panel comprises a display area and a sensor light-receiving area disposed in the display area, the light-emitting function layer is disposed in the display area and the sensor light-receiving area, the photo spacer layer comprises a plurality of first photo spacers disposed in the display area and arranged at intervals with each other, and a plurality of second photo spacers disposed in the sensor light-receiving area and arranged at intervals with each other, and each of the plurality of first photo spacers and the plurality of second photo spacers is disposed on a surface of the pixel defining layer away from the array substrate and protrudes from the surface of the pixel defining layer; and wherein a distribution density of the plurality of second photo spacers over a total area of the sensor light-receiving area is less than a distribution density of the plurality of first photo spacers over a total area of the display area, wherein a total projection area of each of the second photo spacers in a direction perpendicular to the array substrate is less than a total projection area of each of the first photo spacers in the direction perpendicular to the array substrate.

2. The display panel in claim 1, wherein a material of the photo spacer layer comprises an organic photoresist material.

3. The display panel in claim 1, wherein the array substrate comprises a thin film transistor array and an organic planarization layer covering the thin film transistor array, and the photo spacer layer is disposed on a side of the organic planarization layer away from the thin film transistor array;

wherein a thickness of the organic planarization layer ranges from 1 micron to 1.3 microns.

4. The display panel in claim 3, wherein the pixel defining layer is disposed between the organic planarization layer and the photo spacer layer, wherein a plurality of pixel openings are defined in the pixel defining layer, and the light-emitting function layer is disposed in the plurality of pixel openings;

wherein a thickness of the pixel defining layer ranges from 1 micron to 1.3 microns.

5. The display panel in claim 4, wherein the plurality of pixel openings comprise a plurality of first pixel openings located in the display area and a plurality of second pixel openings located in the sensor light-receiving area;

wherein a distribution density of the plurality of second pixel openings is less than a distribution density of the plurality of first pixel openings.

6. The display panel in claim 4, wherein a material of the pixel defining layer is same as a material of the photo spacer layer.

7. The display panel in claim 4, wherein a plurality of anodes are disposed between the pixel defining layer and the organic planarization layer, and the plurality of anodes correspond one-to-one to the plurality of pixel openings;

wherein the light-emitting function layer comprises a hole-injection layer disposed on each of the anodes, a hole transport layer, a light-emitting layer, an electron transport layer, an electron injection layer, and a cathode layer; the hole transport layer, the light-emitting layer, the electron transport layer, the electron injection layer, and the cathode layer are sequentially disposed on the hole-injection layer; and the hole-injection layer, the hole transport layer, the electron transport layer, the electron injection layer, and the cathode layer all extend to cover the pixel definition layer and the photo spacer layer.

8. The display panel in claim 1, wherein the display panel further comprises a base substrate disposed on a side of the array substrate away from the photo spacer layer, and a package layer, a polarizer, and a protective cover plate sequentially disposed on a side of the light-emitting function layer away from the photo spacer layer.

9. The display panel in claim 8, wherein the display panel further comprises a touch layer disposed between the package layer and the polarizer.

10. A display device, comprising the display panel as claimed in claim 1 and an optical sensor disposed on a back of the display panel; wherein the optical sensor corresponds to the sensor light-receiving area.

11. The display device in claim 10, wherein the optical sensor comprises any one of a camera, a fingerprint recognition sensor, and a face recognition sensor.

12. The display device in claim 10, wherein a material of the photo spacer layer comprises an organic photoresist material.

13. The display device in claim 10, wherein the array substrate comprises a thin film transistor array and an organic planarization layer covering the thin film transistor array, and the photo spacer layer is disposed on a side of the organic planarization layer away from the thin film transistor array;

wherein a thickness of the organic planarization layer ranges from 1 micron to 1.3 microns.

14. The display device in claim 13, wherein the pixel defining layer is disposed between the organic planarization layer and the photo spacer layer, wherein a plurality of pixel openings are defined in the pixel defining layer, and the light-emitting function layer is disposed in the plurality of pixel openings;

wherein a thickness of the pixel defining layer ranges from 1 micron to 1.3 microns.

15. The display device in claim 14, wherein the plurality of pixel openings comprise a plurality of first pixel openings located in the display area and a plurality of second pixel openings located in the sensor light-receiving area;

wherein a distribution density of the plurality of second pixel openings is less than a distribution density of the plurality of first pixel openings.

16. The display device in claim 14, wherein a material of the pixel defining layer is same as a material of the photo spacer layer.

17. The display device in claim 14, wherein a plurality of anodes are disposed between the pixel defining layer and the organic planarization layer, and the plurality of anodes correspond one-to-one to the plurality of pixel openings; and wherein the light-emitting function layer comprises a hole-injection layer disposed on each of the anodes, a hole transport layer, a light-emitting layer, an electron transport layer, an electron injection layer, and a cathode layer; the hole transport layer, the light-emitting layer, the electron transport layer, the electron injection layer, and the cathode layer are sequentially disposed on the hole-injection layer; and the hole-injection layer, the hole transport layer, the electron transport layer, the electron injection layer, and the cathode layer all extend to cover the pixel definition layer and the photo spacer layer.

18. The display device in claim 10, wherein the display panel further comprises a base substrate disposed on a side of the array substrate away from the photo spacer layer, and a package layer, a polarizer, and a protective cover plate sequentially disposed on a side of the light-emitting function layer away from the photo spacer layer.

\* \* \* \* \*

UNITED STATES PATENT AND TRADEMARK OFFICE
CERTIFICATE OF CORRECTION

| | | |
|---|---|---|
| PATENT NO. | : 11,515,365 B2 | Page 1 of 1 |
| APPLICATION NO. | : 16/963514 | |
| DATED | : November 29, 2022 | |
| INVENTOR(S) | : Wanghui Guo | |

It is certified that error appears in the above-identified patent and that said Letters Patent is hereby corrected as shown below:

On the Title Page

Item (30) should be added as follows:
Foreign Application Priority Data
May 07, 2020 (CN).............................. 202010376394.6

Signed and Sealed this
Thirtieth Day of May, 2023

*Katherine Kelly Vidal*

Katherine Kelly Vidal
*Director of the United States Patent and Trademark Office*